United States Patent
Razavi et al.

(10) Patent No.: US 7,149,128 B2
(45) Date of Patent: Dec. 12, 2006

(54) DATA LATCH

(75) Inventors: Behzad Razavi, Los Angeles, CA (US); Han-Chang Kang, Taipei Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 150 days.

(21) Appl. No.: 10/904,567

(22) Filed: Nov. 16, 2004

(65) Prior Publication Data

US 2006/0104123 A1 May 18, 2006

(51) Int. Cl.
*G11C 7/10* (2006.01)
(52) U.S. Cl. ............ 365/189.05; 365/189.09; 365/205; 365/230.08
(58) Field of Classification Search ........ 365/189.05, 365/189.09, 205, 230.08
See application file for complete search history.

(56) References Cited

U.S. PATENT DOCUMENTS 5,056,064 A * 10/1991 Iwahashi et al. ......... 365/233.5
5,740,115 A * 4/1998 Ishibashi et al. ............ 365/203
6,327,203 B1 * 12/2001 Won .......................... 365/205

* cited by examiner

*Primary Examiner*—Tuan T. Nguyen
(74) *Attorney, Agent, or Firm*—Winston Hsu

(57) ABSTRACT

A high-speed latch includes a latch unit and a first current source. The latch unit has a first input terminal for receiving a first input signal and a first output terminal for outputting a first output signal. The first current source is coupled to the first output terminal, and is enabled for providing the first output terminal with a first driving current to reduce a voltage difference between the first output signal and the first input signal when the first output signal and the first input signal correspond to different logic states.

19 Claims, 3 Drawing Sheets

DATA LATCH

BACKGROUND OF INVENTION

1. Field of the Invention

The invention relates to a data latch, and more particularly, to a high-speed data latch.

2. Description of the Prior Art

A data latch is a common device used in digital circuits for latching an input signal. For instance, a conventional flip-flop composed of two latches is often used for implementing a frequency divider in a digital circuit. However, as a result of the ever-increasing operating speeds of digital circuits, one important issue is to overcome the slow response speed of the latch. Please refer to FIG. 1 showing a schematic diagram of high-speed latch 10 implemented using NMOS transistors according to the prior art. As shown in FIG. 1, the high-speed latch 10 includes a clocked current source 20, a differential amplifier 30, and a latch unit 40. The clocked current source 20 includes three NMOS transistors 22, 24, 26. The NMOS transistors 22 and 24 are enabled (turned on) by the clock signals CKP and CKN, respectively. Please note that the clock signal CKN is an inverse signal of the clock signal CKP. Therefore, the NMOS transistors 22, 24 are alternately enabled. As shown in FIG. 1, the NMOS transistor 26 is enabled by a predetermined bias voltage $V_{bias}$ to provide the enabled NMOS transistor 22 or 24 with a predetermined current $I_{bias}$.

The differential amplifier 30 has two NMOS transistors 32, 34 and two resistors 36, 38, wherein nodes A, B correspond to the output terminals of the differential amplifier 30. Because the differential amplifier 30 is well-understood to those of ordinary skill in the art, further description of the differential amplifier 30 is omitted for the sake of brevity. The latch unit 40 has a cross-coupling pair established by the NMOS transistors 42, 44. Consequently, when the clock signal CKP is logic high, the differential amplifier 30 is enabled to allow the differential input signals $V_{in}+$, $V_{in}-$ to drive the differential output signals $V_{out}+$, $V_{out}-$ outputted from nodes A and B, respectively. Then, the differential amplifier 30 is disabled due to the clock signal CKP being logic low. The latch unit 40 then holds the output signals $V_{out}+$, $V_{out}-$ until the clock signal CKP becomes logic high again.

Please note that the resistors 36 and 38 are needed to act as a load of the differential amplifier 30. Due to the semiconductor process, the resistors 36 and 38 require a large area of space within the integrated circuit. Therefore, if the conventional latch 10 shown in FIG. 1 is utilized in the digital circuit, the required chip area of the corresponding integrated circuit is large owing to the large-size resistors 36 and 38.

SUMMARY OF INVENTION

One of the objectives of the claimed invention is therefore to provide a latch to solve the above-mention problem.

According to the claimed invention, a high-speed latch is disclosed. The latch includes a latch unit comprising a first input terminal for receiving a first input signal and a first output terminal for outputting a first output signal; and a first current source coupled to the first output terminal, the first current source being enabled for providing the first output terminal with a first driving current to reduce a voltage difference between the first output signal and the first input signal when the first output signal and the first input signal correspond to different logic states.

In addition, the claimed invention discloses a method of forming a latch. The method comprises providing a latch unit comprising a first input terminal for receiving a first input signal and a first output terminal for outputting a first output signal; and providing the first output terminal with a first driving current when the first output signal and the first input signal correspond to different logic states.

Another objective of the claimed invention is to provide a flip-flop. The flip-flop comprises at least two latches coupled in series. Each of the latches comprises a latch unit comprising a first input terminal for receiving a first input signal and a first output terminal for outputting a first output signal; and a first current source being enabled for providing the first output terminal with a first driving current when the first output signal and the first input signal correspond to different logic states.

It is an advantage of the claimed invention that the current sources can provide an auxiliary driving current so as to reduce the settling time and chip area of the latch.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
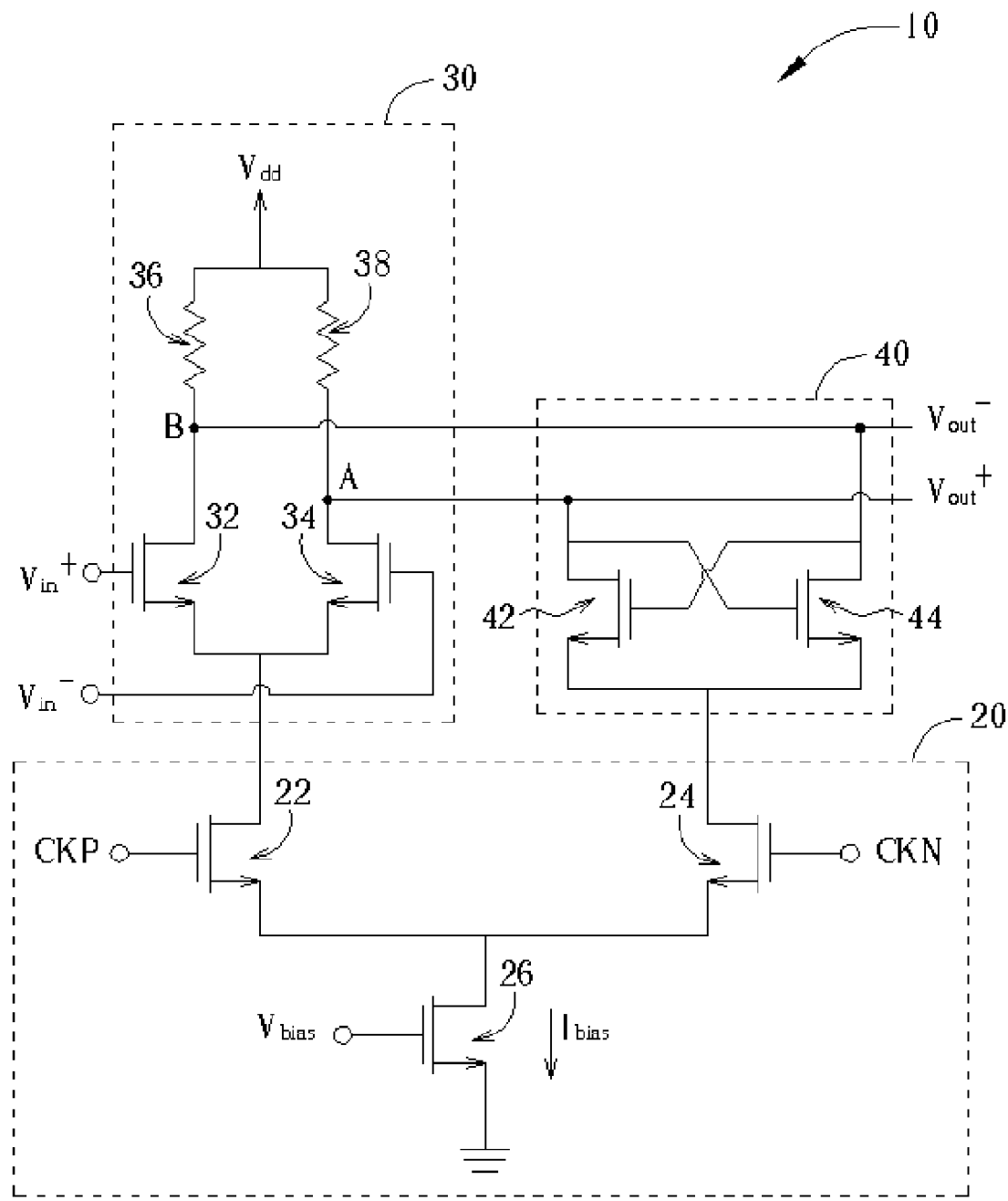
FIG. 1 is schematic diagram of a latch according to the prior art.
Figure 2:
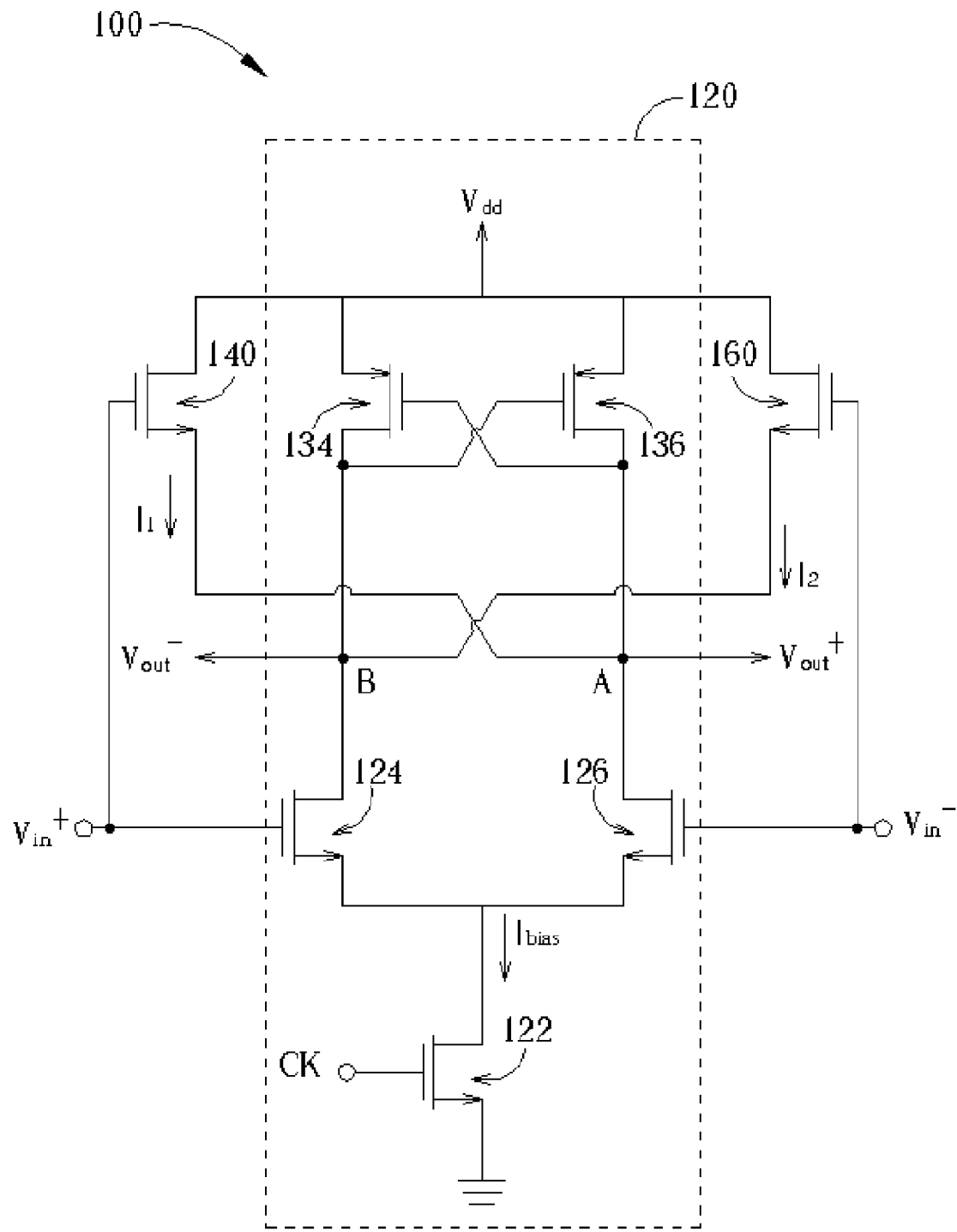
FIG. 2 is a schematic diagram of a latch according to an embodiment of the present invention.

Please refer to FIG. 2, which is a schematic diagram of a high-speed latch 100 according to the present invention. As shown, the latch 100 includes a latch unit 120 and two current sources 140, 160. The latch unit 120 has differential output terminals A, B. In an embodiment, the latch unit 120 is composed of NMOS transistors 122, 124, 126 and PMOS transistors 134, 136. The NMOS transistor 122 is used to provide a bias current $I_{bias}$ for the NMOS transistors 124 and 126 when the clock signal CK is logic high. That is, if the NMOS transistor 122 is enabled (turned on), the bias current $I_{bias}$ is induced. It is clear that only when the clock signal CK is logic high, the latch unit 120 is active and able to drive the differential output signals $V_{out}+$, $V_{out}-$ according to the differential input signals $V_{in}+$, $V_{in}-$. The related operation is further detailed in the flowing description.

As shown in FIG. 2, the NMOS transistors 124, 126 act as a differential pair to receive the differential input signals $V_{in}+$, $V_{in}-$ inputted into the differential input terminals (i.e., the gates of the NMOS transistors 124 and 126) and are enabled when the clock signal CK is logic high. The NMOS transistors 134, 136 establish a cross-coupling pair used to latch the differential output signals $V_{out}+$, $V_{out}-$ according to the differential input signals $V_{in}+$, $V_{in}-$ when the clock signal CK is logic high, and to keep the logic values of the differential output signals $V_{out}+$, $V_{out}-$ when the clock signal CK is logic low. In the following, assume that when the clock signal CK is logic high, the logic values of the differential input signal $V_{in}+$ and the differential output signal $V_{out}+$ are the same, and the logic values of the differential input signal $V_{in}-$ and the differential output signal $V_{out}-$ are the same. For example, when the logic values of the differential input signals $V_{in}+$, $V_{in}-$ respectively correspond to "1" and "0", the logic values of the differential output signals $V_{out}+$, $V_{out}-$ respectively correspond to "1" and "0" as well. To begin operations, the NMOS transistor 124 is turned on while the NMOS transistor 126 is turned off. Therefore, the PMOS transistor 134 is turned off according to the output voltage $V_{out}+$ coupled to the gate of the PMOS transistor 134, and the differential output voltage $V_{out}-$ is coupled to the ground due to the turned-on NMOS transistor 124. The differential output voltage $V_{out}-$ thus is still logic low. On the other hand, the PMOS transistor 136 is turned on according to the differential output voltage $V_{out}-$ coupled to the gate of the PMOS transistor 136, and the differential output voltage $V_{out}+$ is coupled to $V_{dd}$ accordingly. Though the NMOS transistor 140 functioning as a current source is turned on to provide the differential output node A with a driving current $I_1$, the differential output voltage $V_{out}+$ still holds $V_{dd}$ to maintain logic high.

Concerning another operating situation, assume that the clock signal CK is also logic high, but the logic values of the differential input signals $V_{in}+$, $V_{in}-$ are different from the corresponding differential output signals $V_{out}+$, $V_{out}-$. For example, the logic values of the differential input signals $V_{in}+$, $V_{in}-$ respectively correspond to "0" and "1", but the logic values of the differential output signals $V_{out}+$, $V_{out}-$ respectively correspond to "1" and "0". Firstly, the NMOS transistor 126 is turned on owing to the differential input voltage $V_{in}-$ being logic high, the PMOS transistor 136 is turned on owing to the differential output voltage $V_{out}-$ being logic low, the PMOS transistor 134 is turned off owing to the differential output voltage $V_{out}+$ being logic high, and the NMOS transistor 124 is turned off owing to the differential input voltage $V_{in}+$ being logic low. As one can see, the turned-on NMOS transistor 126 pulls down the differential output voltage $V_{out}+$ due to the ground. Owing to the voltage drop of the differential output voltage $V_{out}+$, the PMOS transistor 134 is turned on, and starts pushing up the differential output voltage $V_{out}-$ accordingly.

Please note that the NMOS transistor 160 is turned on owing to the differential input voltage $V_{in}-$ being logic high, and is capable of providing the differential output node B with a driving current $I_2$. Because the NMOS transistor 160 drives the differential output voltage $V_{out}-$ toward $V_{dd}$ more quickly than the PMOS transistor 134 does, the voltage level of the differential output voltage $V_{out}-$ is quickly raised. After the voltage level of the differential output voltage $V_{out}-$ is high enough, the PMOS transistor 136 is turned off, which makes the voltage level of the differential output voltage $V_{out}+$ further go down. In the end, the logic values of the differential output signals $V_{out}+$, $V_{out}-$ become "0" and "1", and are kept when the clock signal becomes logic low to disable the bias current $I_{bias}$. In other words, the logic values of the differential output signals $V_{out}+$, $V_{out}-$ are not changed until the clock signal CK is logic high again.

In this preferred embodiment, the NMOS transistor 140 coupled to the differential output node A is used for speedily boosting the voltage level of the differential output signal $V_{out}+$ through the generated driving current $I_1$ when the clock signal CK and the differential input signal $V_{in}+$ are both logic high and the differential output signal $V_{out}+$ is logic low. Similarly, the NMOS transistor 160 coupled to the differential output node B is used for speedily boosting the voltage level of the differential output signal $V_{out}-$ through the generated driving current $I_2$ when the clock signal CK and the differential input signal $V_{in}-$ are logic high and the differential output signal $V_{out}-$ is logic low. Therefore, the NMOS transistors 140, 160 having higher mobility help the PMOS transistors 134, 136 to decrease the differences between the differential output signals $V_{out}+$, $V_{out}-$ and the corresponding differential input signals $V_{in}+$, $V_{in}-$ quickly, thereby significantly reducing the settling time of the latch 100.

Please note that the types of MOS transistors in the latch 100 and the connections among these MOS transistors are not limited to the embodiment. That is, with a moderate modification to the circuit structure, the NMOS transistors 122, 124, 126 in the latch 100 can be replaced with PMOS transistors and the PMOS transistors 134, 136 in the latch 100 can be replaced with NMOS transistors. In addition, the latch 100 shown in FIG. 2 is a differential latch having differential input signals $V_{in}+$, $V_{in}-$. Additionally, the feature of combining a latch unit with an auxiliary current source (the NMOS transistor 140 or 160 shown in FIG. 2) is also capable of being applied to a single-ended latch. The same advantages of quicker settle time and minimized chip area are achieved.

Figure 3:
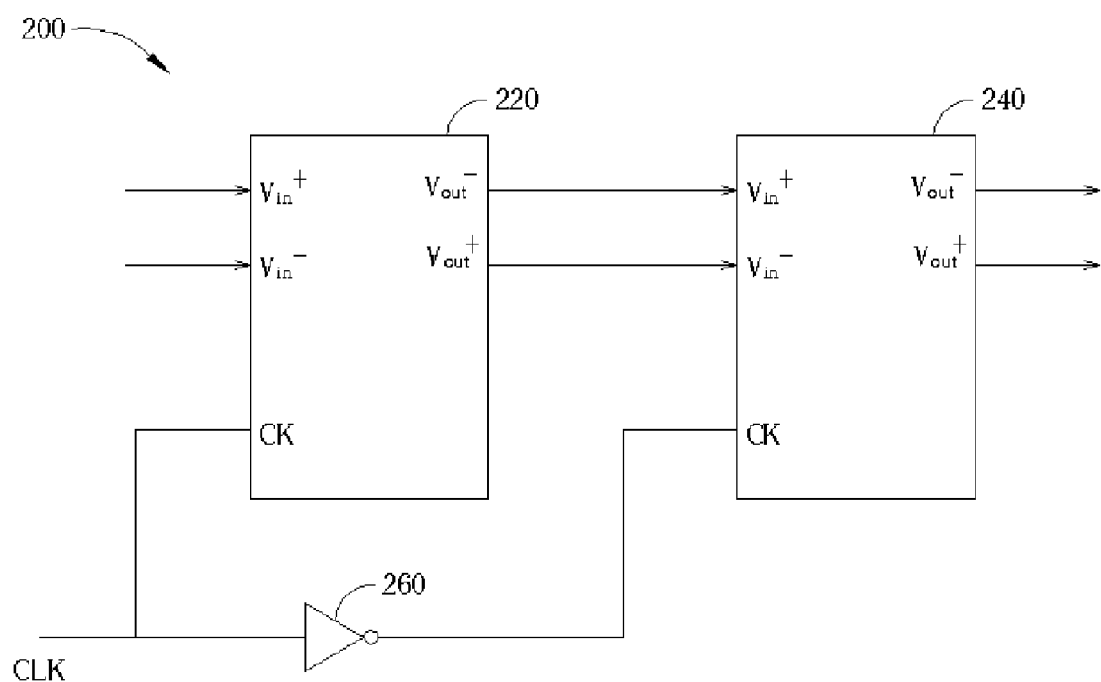
FIG. 3 is schematic diagram of a D-type flip-flop implemented by two latches according to the present invention.

Please refer to FIG. 3, which is schematic diagram of a D-type flip-flop 200 according to the present invention. As shown in FIG. 3, the flip-flop 200 includes two latch 220, 240 connected in series and an inverter 260. Each of the latches 220, 240 is a latch as shown in FIG. 2. In an embodiment, the latch 220 is triggered via the rising edge of the clock signal CLK, and the following latch 240 is triggered via the falling edge of the clock signal CLK. However, as mentioned above, the types of MOS transistors in the latch is adjustable according to different design concerns. That is, the latches 220, 240 are not limited to having the same circuit structure. For instance, the original flip-flop 200 with an appropriate modification is capable of having the same trigger condition without the inverter 260, which will be apparent to anyone skilled in the art. It is clear that the kernel difference between the high-speed D-type flip-flop 200 and a conventional D-type flip-flop is the inner circuit structure of the implemented latches 220, 240. In an embodiment, the circuit structure and related operation of the latch 100, 220, and 240 are substantially the same. Please note that the latch 100 of the invention is not limited to being used to implement flip-flops, other high-speed electronic devices can adopt the high-speed latches of the invention instead of the conventional latches to obtain shorter settling time and smaller chip size.

The latch of the invention provides two MOS transistors acting as current sources for passing a driving current to corresponding output terminals of the latch. The driving current is used to simultaneously speed up the level transition of the differential output signals and reduce the settle time. As a result, the latch according to the present invention is suitable for applications requiring high operating speed and small chip size.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A latch comprising:
 a latch unit comprises a first input terminal for receiving a first input signal and a first output terminal for outputting a first output signal; and a first current source being enabled for providing the first output terminal with a first driving current when the first output signal and the first input signal correspond to different logic states.

2. The latch of claim 1, wherein
the latch unit further comprises a second input terminal for receiving a second input signal, and a second output terminal for outputting a second output signal; and
the latch further comprises a second current source being enabled for providing the second output terminal with a second driving current when the second output signal and the second input signal correspond to different logic states.

3. The latch of claim 2, wherein the second current source provides the second driving current to the second output terminal such that a voltage difference between the second output signal and the second input signal is reduced.

4. The latch of claim 2, wherein
the first input signal and the second input signal are differential input signals; and
the first output signal and the second output signal are differential output signals.

5. The latch of claim 4, wherein the first and the second current sources are enabled by the first and the second input signals, respectively.

6. The latch of claim 5, wherein each of the first current sources and the second current sources is a transistor.

7. The latch of claim 1, wherein the first current source provides the first driving current to the first output terminal such that a voltage difference between the first output signal and the first input signal is reduced.

8. The latch of claim 7, wherein the first current source is enabled by the first input signal.

9. A flip-flop comprising:
at least two latches coupled in series, each of the latches comprising:
a latch unit comprising a first input terminal for receiving a first input signal and a first output terminal for outputting a first output signal; and
a first current source, coupled to the first output terminal, being enabled for providing the first output terminal with a first driving current when the first output signal and the first input signal correspond to different logic states.

10. The flip-flop of claim 9, wherein
the latch unit further comprises a second input terminal for receiving a second input signal, and a second output terminal for outputting a second output signal; and
each of the latches further comprises a second current source being coupled to the second output terminal and being enabled for providing the second output terminal with a second driving current when the second output signal and the second input signal correspond to different logic states.

11. The latch of claim 10, wherein the second current source provides the second driving current to the second output terminal such that a voltage difference between the second output signal and the second input signal is reduced.

12. The flip-flop of claim 10, wherein the first and the second current sources are enabled by the first and the second input signals, respectively.

13. The flip-flop of claim 12, wherein each of the first current sources and the second current sources is a transistor.

14. A method of latching data, the method comprising:
providing a latch unit comprising a first input terminal the receiving a first input signal and a first output terminal for outputting a first output signal; and
providing the first output terminal with a first driving current when the first output signal and the first input signal correspond to different logic states.

15. The method of claim 14, wherein the first driving current is provided to the first output terminal such that a voltage difference between the first output signal and the first input signal is reduced.

16. The method of claim 15, wherein the first driving current is enabled by the first input signal.

17. The method of claim 15, wherein the latch unit further comprises a second input terminal for receiving a second input signal, and a second output terminal for outputting a second output signal, the method further comprises:
providing the second output terminal with a second driving current when the second output signal and the second input signal correspond to different logic states.

18. The method of claim 17, wherein the first and the second driving currents are enabled by the first and the second input signals, respectively.

19. The method of claim 17, wherein the first and the second input signals are differential input signals.

* * * * *